(12) United States Patent
Hidaka et al.

(10) Patent No.: US 7,712,001 B2
(45) Date of Patent: May 4, 2010

(54) SEMICONDUCTOR INTEGRATED CIRCUIT AND METHOD OF TESTING SEMICONDUCTOR INTEGRATED CIRCUIT

(75) Inventors: Itsuo Hidaka, Kanagawa (JP); Tsuneki Sasaki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 322 days.

(21) Appl. No.: 11/358,135

(22) Filed: Feb. 22, 2006

(65) Prior Publication Data
US 2006/0190786 A1    Aug. 24, 2006

(30) Foreign Application Priority Data
Feb. 23, 2005    (JP)    ............... 2005-047967

(51) Int. Cl.
G01R 31/28    (2006.01)
H03K 19/00    (2006.01)
(52) U.S. Cl. .................... 714/726; 714/727; 326/16
(58) Field of Classification Search ................ 714/726, 714/724; 326/16
See application file for complete search history.

(56) References Cited
U.S. PATENT DOCUMENTS

| | | | | |
|---|---|---|---|---|
| 4,764,926 A | * | 8/1988 | Knight et al. ............... | 714/733 |
| 5,844,921 A | * | 12/1998 | Bou-Ghazale et al. ...... | 714/724 |
| 6,442,721 B2 | * | 8/2002 | Whetsel ....................... | 714/726 |
| 7,219,281 B2 | * | 5/2007 | Dubey ......................... | 714/727 |
| 2003/0126532 A1 | * | 7/2003 | Huch et al. .................. | 714/726 |
| 2003/0126533 A1 | * | 7/2003 | McAdams ................... | 714/727 |
| 2007/0168804 A1 | * | 7/2007 | Harada ........................ | 714/726 |

FOREIGN PATENT DOCUMENTS

JP    2001-208810    8/2001

* cited by examiner

*Primary Examiner*—Kevin L Ellis
*Assistant Examiner*—Daniel F McMahon
(74) *Attorney, Agent, or Firm*—McGinn IP Law Group, PLLC

(57) ABSTRACT

A semiconductor integrated circuit having an internal circuit which is tested based on a scanning method is provided. The internal circuit has: memory elements including a first memory element and a second memory element; combinational circuits including a first combinational circuit receiving an external input data, a second combinational circuit outputting an external output data and a third combinational circuit; a first selection circuit; and a second selection circuit. The first selection circuit receives the external input data and a stored data held by the first memory element, and outputs any of them to the first combinational circuit. The second selection circuit receives the external output data output from the second combinational circuit and an operation result data output from the third combinational circuit, and outputs any of them to the second memory element.

5 Claims, 9 Drawing Sheets

SEMICONDUCTOR INTEGRATED CIRCUIT AND METHOD OF TESTING SEMICONDUCTOR INTEGRATED CIRCUIT

BACKGROUND OF THE INVENTION

1. Field of the Invention

The present invention relates to a test-specific circuit provided for detecting failures of a semiconductor integrated circuit, and a method of testing a semiconductor integrated circuit.

2. Description of the Related Art

An internal scanning method is known as one method of "design-for-testability" of a semiconductor integrated circuit. According to the internal scanning method, a sequential circuit provided in a semiconductor integrated circuit is expanded into combinational circuits and memory elements such as flip-flops, and signals are directly controlled and monitored by using external terminals. A test-specific path which penetrates through all sequential circuits (including memory elements) in a logic circuit of the semiconductor integrated circuit is provided, and the sequential circuits operate as a single shift register as a whole. It is possible to directly monitor internal signals by controlling the shift register. Such the single shift register is referred to as a "scan chain".

By using the scan chain, it is possible to control input-output terminals (ports) of the combinational circuits from the external terminals (pins/ports) of the semiconductor integrated circuit. As a result, a logic value of any of the memory elements can be set to "1" or "0". A sequence of the logic values set in the memory elements is referred to as a "pattern (test pattern)". When a test pattern is set in the memory elements and outputs of the memory elements are supplied as test input data to the combinational circuits, the test pattern is referred to as an "input pattern". On the other hand, when outputs of the combinational circuits are taken in the memory elements and a test pattern stored in the memory elements is output as test result data, the test pattern is referred to as an "output pattern". Since the logic pattern of any combinational circuit is known, it is possible to compute (estimate) an output pattern corresponding to an input pattern. Thus, an input pattern capable of detecting all failures which may occur in the combinational circuits can be automatically produced through a computer simulation.

In the meanwhile, a semiconductor integrated circuit with large scale integration and multiple functions is developing, and hence shared usage of a functional circuit (functional block) is activated. Such a circuit functional block that can be utilized in common and plays a role of foundation on a semiconductor chip is referred to as a "macro circuit" or an "IP (Intellectual Property) core".

Input/output terminals (ports) of the combinational circuits included in a semiconductor integrated circuit can be classified into the following three types:

Type-1: An input terminal of a combinational circuit which is connected to an output of a memory element.

Type-2: An output terminal of a combinational circuit which is connected to an input of a memory element.

Type-3: An input terminal or an output terminal of a combinational circuit which is not connected to a memory element but to another combinational circuit or external input/output terminals of the semiconductor integrated circuit.

In a case of a combinational circuit whose all input terminals are of the Type-1 and all output terminals are of the Type-2, the input pattern can be set in the memory elements connected to the all input terminals and the output pattern can be taken in the memory elements connected to the all output terminals. It is thus possible to detect all failures of the combinational circuit. However, in a case of a combinational circuit having an input terminal of the Type-3 or an output terminal of the Type-3, the input pattern can not be set appropriately or the output pattern can not be obtained. It is therefore impossible to detect a part of or all of failures which may occur in the combinational circuit.

With reference to FIG. 1, a case in which input/output terminals of the Type-1 to Type-3 are mixed will be described. FIG. 1 is a schematic view showing a configuration of a semiconductor integrated circuit 100. The semiconductor integrated circuit 100 has a macro circuit 123, combinational circuits 121, 125 and 127, and flip-flops 131, 132, 133, 134, 135 and 136. Signals (data) are input to the semiconductor integrated circuit 100 through external input terminals 111 and 112, and signals (data) are output from the semiconductor integrated circuit 100 through external output terminals 117, 118 and 119. Further, the semiconductor integrated circuit 100 is provided with a test-specific input terminal 114 and a test-specific output terminal 115.

External input data are input to the combinational circuit 121 through respective of the external input terminal 111 and the external input terminal 112. An output data of the combinational circuit 121 is input to the flip-flop 131 and held by the flip-flop 131. An output data of the flip-flop 131 is input to the macro circuit 123. Output data of the macro circuit 123 are input to respective of the flip-flops 132 to 134 and held by the flip-flops 132 to 134. Output data of respective of the flip-flops 132 to 134 are input to the combinational circuit 125. Output data of the combinational circuit 125 are input to respective of the flip-flops 135 and 136 and held by the flip-flops 135 and 136. Output data of respective of the flip-flops 135 and 136 are input to the combinational circuit 127. Output data of the combinational circuit 127 are output as external output data through respective of the output terminals 117 to 119 to the outside of the semiconductor integrated circuit 100.

The above-mentioned configuration (connection) is that in a "normal mode" in which the semiconductor integrated circuit 100 is set to operate normally. In addition to that, the semiconductor integrated circuit 100 can be set to a "test mode". In the test mode, the above-mentioned flip-flops 131 to 136 are connected serially one after another to form a shift register, which is a test circuit. In the test mode, an input test pattern is input to the semiconductor integrated circuit 100 through the test-specific input terminal (serial input terminal) 114. The input test pattern is shifted in the flip-flops 131 to 136 in order, and the input test pattern is set in respective of the flip-flops 131 to 136. Also, test result data held by respective of the flip-flops 131 to 136 are output as an output test pattern from the semiconductor integrated circuit 100 through the test-specific output terminal (serial output terminal) 115.

The input terminals of the combinational circuit 121 are classified as the Type-3 and the output terminal thereof is classified as the Type-2. The input terminals of the combinational circuit 125 are classified as the Type-1, and the output terminals thereof are classified as the Type-2. The input terminals of the combinational circuit 127 are classified as the Type-1, and the output terminals thereof are classified as the Type-3. In this case, failures as to the combinational circuits 121 and 127 can not be detected, although all failures of the combinational circuit 125 are detected. Therefore, an external test apparatus (not shown) is provided and connected to the external input terminals 111 and 112, and an input pattern is supplied to the combinational circuit 121 at the time when the semiconductor integrated circuit 100 is tested. Also, an external test apparatus (not shown) is provided and connected to the external output terminals 117 to 119 so that output data of the combinational circuit 127 can be derived from the semiconductor integrated circuit 100. As explained above, all failures which may occur in the combinational circuits 121 and 127 can be detected by connecting the external input/output terminals of the semiconductor integrated circuit 100 with the external test apparatus.

When the macro circuit 123 is constituted only by combinational circuits, the test of the semiconductor integrated circuit 100 is performed as follows. First, the semiconductor integrated circuit 100 is set to the test mode, and the flip-flops 131 to 136 are connected in series one after another. An input test pattern is input through the serial input terminal 114 and hence the input test pattern is set in respective of the flip-flops 131 to 136. The test pattern held by the flip-flops 131 to 136 is supplied to the macro circuit (combinational circuit) 123, the combinational circuits 125 and 127. Also, an input test pattern is input to the combinational circuit 121 from the external test apparatus through the external input terminals 111 and 112. Then, each of the combinational circuits 121, 123, 125 and 127 outputs an operation result data indicative of a result of logic operation.

Next, the connection with regard to the flip-flops 131 to 136 is switched from the above-mentioned serial connection to the normal connection. Then, the operation result data output from the combinational circuit 121 is held by the flip-flop 131. The operation result data output from the combinational circuit 123 are held by the flip-flops 132 to 134. The operation result data output from the combinational circuit 125 are held by the flip-flop 135 and the flip-flop 136. Also, the operation result data output from the combinational circuit 127 are stored in a memory in the external test apparatus which is connected to the external output terminals 117 to 119.

Next, the connection with regard to the flip-flops 131 to 136 is switched to the above-mentioned serial connection again. Then, the operation result data held by the flip-flops 131 to 136 are sequentially output from the serial output terminal 115. The operation result data obtained in the test mode (the operation result data output from the serial output terminal 115 or stored in the external test apparatus) are compared with predetermined expected values. In this manner, the normality of the semiconductor integrated circuit 100 is checked. In the case when the macro circuit 123 is a combinational circuit, the failures can be detected with respect to all of the circuits in accordance with the above-described testing method.

Next, let us consider a case when the macro circuit 123 is constituted by sequential circuits. In this case, the output of the macro circuit 123 depends upon input history. Therefore, if an internal configuration of the macro circuit 123 is not disclosed, an output test pattern cannot be calculated only by an input test pattern. Thus, the internal circuits of the semiconductor integrated circuit 100 except for the macro circuit 123 is tested, which deteriorates failure detection rate (failure diagnosis rate).

In order to avoid the problem, the macro circuit 123 is expanded into combinational circuits if the internal configuration of the macro circuit 123 is disclosed. That is, circuits in the macro circuit 123 are separated into combinational circuits and flip-flops. The flip-flops are newly connected to the above-mentioned scan chain outside the macro circuit 123, and thus a new scan chain is constructed. By the use of the new scan chain, the semiconductor integrated circuit 100 can be tested in a similar manner to the above. In this case, a test pattern used for testing the macro circuit 123 must be prepared for every circuit. In particular, when the macro circuit 123 is a large scale one, burdens are increased. Moreover, according to the above method, a pattern design is performed after the scan chain is wired in the chip design. At this time, the circuit configuration of the macro circuit or the chip must be disclosed to a pattern designer. Therefore, the above-mentioned method can not be adopted if the circuit configuration of the macro circuit cannot be opened to the pattern designer.

When an internal configuration of a macro circuit is not opened, the macro circuit and the other circuits may be tested independently by separating the macro circuit from the other circuits. In this case, a terminal of the Type-3 appears in a boundary between the macro circuit and the other circuits. That is, a terminal to which an input test pattern can not be input or a terminal from which an output test pattern can not be derived appears in the boundary between the macro circuit and the other circuits. In the case when the circuit 100 shown in FIG. 1 is a semiconductor chip as in the above explanation, it is possible to supply the input test pattern and derive the output test pattern by connecting the external test apparatus with the external input and output terminals. However, in a case when the circuit 100 shown in FIG. 1 is assumed to be a macro circuit inside the semiconductor chip, the external test apparatus cannot be connected to input/output terminals of the macro circuit. That is, in the case when the macro circuit 100 and the peripheral circuit are tested independently, it is not possible to provide a device which is directly connected to the macro terminals 111, 112, 117, 118 and 119 of the macro circuit 100 for inputting the input test pattern and deriving the output test pattern. In this case, an input test pattern can not be set in the combinational circuit 121 provided between the macro terminals 111, 112 and the flip-flop 131. Moreover, an operation result data can not be derived from the combinational circuit 127 provided between the macro terminals 117 to 119 and the flip-flops 135 and 136. As a result, the failure detection rate is reduced.

FIG. 2 shows another example, which is for preventing the reduction of the failure detection rate. In FIG. 2, additional flip-flops are provided for respective of the macro terminals, and the additional flip-flops are incorporated into the above-mentioned scan chain. For example, a flip-flop 151 and a selecting circuit 161 are provided for the macro terminal 111. The selecting circuit 161 selects data from the macro terminal 111 in the normal mode, while selects the input test pattern set in the flip-flop 151 in the test mode. The selecting circuit 161 outputs the selected data to the combinational circuit 121. Similarly, a flip-flop 152 and a selecting circuit 162 are provided for the macro terminal 112. A flip-flop 153 is provided for the macro terminal 117 on the output side. An operation result data output from the combinational circuit 127 to the macro terminal 117 is held by the flip-flop 153. Similarly, a flip-flop 154 is provided for the macro terminal 118, and a flip-flop 155 is provided for the macro terminal 119. These flip-flops 154 and 155 hold operation result data, respectively. The flip-flops 151 to 155 are connected to the above-mentioned scan chain which is constituted by the flip-flops 131 to 136. As a result, a new scan chain is constructed which is constituted by the flip-flops 131 to 136 and 151 to 155. By using the new scan chain, it becomes possible to detect failures which may occur in the combinational circuits 121 and 127. However, a total number of the flip-flops are increased by the number of the macro terminals of the macro circuit 100, which enlarges an area occupied by the macro circuit. In particular, a macro circuit mounted on an LSI in recent years is equipped with multiple functions and hence a large number of macro terminals. Accordingly, if flip-flops are easily located, a wiring congestion degree is increased and a chip area is increased.

For example, in a case of a macro circuit having about 3000 flip-flops inside, the total number of the macro terminals is nearly 300. In this case, it is necessary to add another 300 flip-flops whose number is equal to the number of the macro terminals. That is to say, the number of flip-flops is increased by 10% in order to improve the failure detection rate, which has an adverse affect on the chip area.

A test technique is disclosed in Japanese Laid-Open Patent Application (JP-P2001-208810A), in which the test is performed for a circuit group including not only a macro circuit but also a part of combinational circuits outside the macro circuit, instead of separating the macro circuit from the other circuits. According to the conventional technique, a scan pattern used for testing the macro circuit is prepared with respect to the circuit group including the macro circuit and the combinational circuits outside the macro circuit. The prepared scan pattern is set in a scan flip-flop on the input side by using a scan-in terminal. An output data of the scan flip-flop is input to the macro circuit through a combinational circuit on the input side out of the combinational circuits outside the macro circuit. An operation result data of the macro circuit is taken in a scan flip-flop on the output side through a combinational circuit on the output side out of the combinational circuits outside the macro circuit. An output data of the scan flip-flop on the output side is output from a scan output terminal as a comparison data which is compared with a predetermined expected value. In this case, it is necessary to prepare a scan pattern used for testing the macro circuit every time the circuit outside the macro circuit is changed, although the macro circuit itself does not change.

SUMMARY OF THE INVENTION

The present invention has recognized the following points. As previously explained, when the additional flip-flops are provided for the macro terminals in order to improve the failure detection rate, the total number of the flip-flops is increased by the number of the macro terminals, which causes increase in the circuit scale and the circuit area.

In a first aspect of the present invention, a semiconductor integrated circuit having an internal circuit which is tested based on the scanning method is provided. The internal circuit has: a plurality of memory elements; a plurality of combinational circuits; a first selection circuit; and a second selection circuit.

The plurality of memory elements can be serially connected one after another when the internal circuit is tested. Due to the serial connection, an input test pattern can be set in the plurality of memory elements, and an output test pattern can be derived from the plurality of memory elements. The plurality of memory elements includes a first memory element and a second memory element. An output of the second memory element is connected to an input of one of the plurality of combinational circuits. The plurality of combinational circuits includes a first combinational circuit to which an external input data is input, a second combinational circuit outputting an external output data and a third combinational circuit. Each of the plurality of combinational circuits output an operation result data indicative of a result of a logic operation.

The first selection circuit receives the external input data and a stored data held by the first memory element. The first selection circuit outputs any of the external input data and the stored data to the first combinational circuit. The second selection circuit receives the external output data output from the second combinational circuit and an operation result data output from the third combinational circuit. The second selection circuit outputs any of the external output data and the operation result data to the second memory element.

In a test mode, the first selection circuit outputs the stored data held by the first memory element to the first combination circuit. It is thus possible without increasing the number of the memory elements to supply the input test pattern to the first combinational circuit which usually receives the external input data through an external input terminal. Moreover, the test mode includes a first test mode and a second test mode. In the first test mode, the second selection circuit outputs the operation result data output from the third combinational circuit to the second memory element. On the other hand, in the second test mode, the second selection circuit outputs the external output data output from the second combinational circuit to the second memory element. The second selection circuit can switch the output. The second memory element, which is usually used for holding the operation result data of the third combinational circuit, is controlled by the second selection circuit to hold the external output data output from the second combinational circuit. It is thus possible to capture the external output data, namely, the operation result data output from the second combinational circuit connected to the external output terminal, by using the second memory element without providing additional memory elements.

According to the present invention, as described above, the first combinational circuit can be tested in the first test mode, while the second combinational circuit can be tested in the second test mode. That is, the internal circuit can be tested in a time-division manner by switching the output of the second selection circuit. Here, it is not necessary to provide any additional memory element. It is therefore possible to improve the failure detection rate with suppressing the increase in the circuit scale and the circuit area.

In another aspect of the present invention, a method of testing an internal circuit of a semiconductor integrated circuit based on a scanning method is provided. The internal circuit has: a plurality of memory elements including a first memory element and a second memory element; and a plurality of combinational circuits including a first combinational circuit to which an external input data is input, a second combinational circuit outputting an external output data and a third combinational circuit. An output of the second memory element is connected to an input of one of the plurality of combinational circuits.

The method includes: (A) testing the internal circuit in a first test mode; and (B) testing the internal circuit in a second test mode. In the (A) testing, a stored data held by the first memory element is input to the first combinational circuit instead of the external input data, and an operation result data output from the third combinational circuit is held by the second memory element. In the (B) testing, a stored data held by the first memory element is input to the first combinational circuit instead of the external input data, and the external output data output from the second combinational circuit is held by the second memory element.

According to the present invention, as described above, the first combinational circuit can be tested in the first test mode, while the second combinational circuit can be tested in the second test mode. That is, the internal circuit can be tested in a time-division manner by switching the output of the second selection circuit. Here, it is not necessary to provide any additional test-specific memory element. It is therefore possible to improve the failure detection rate with suppressing the increase in the circuit scale and the circuit area.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
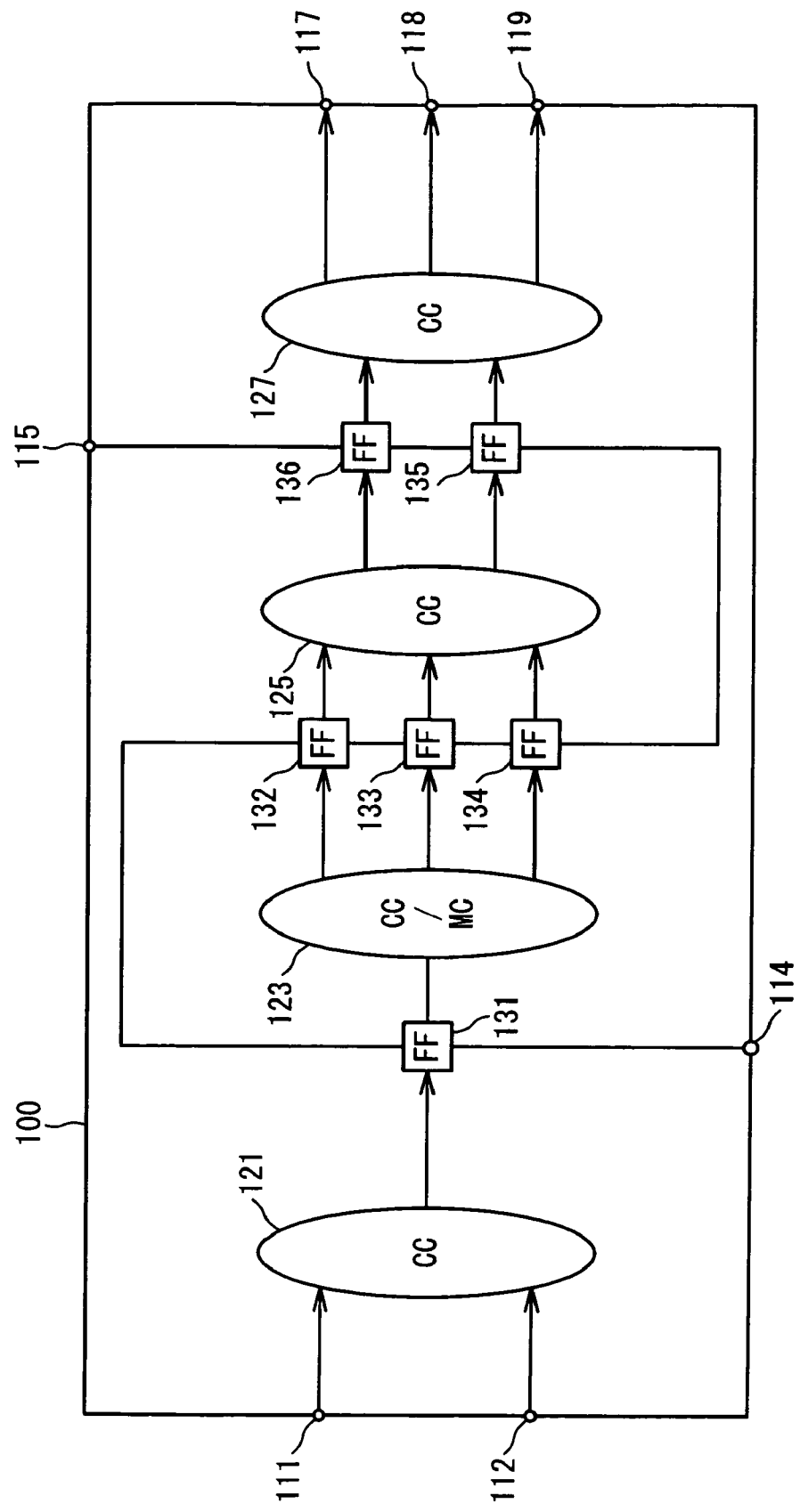
FIG. 1 is a diagram for explaining an example of testing based on the scanning method according to a conventional technique.
Figure 2:
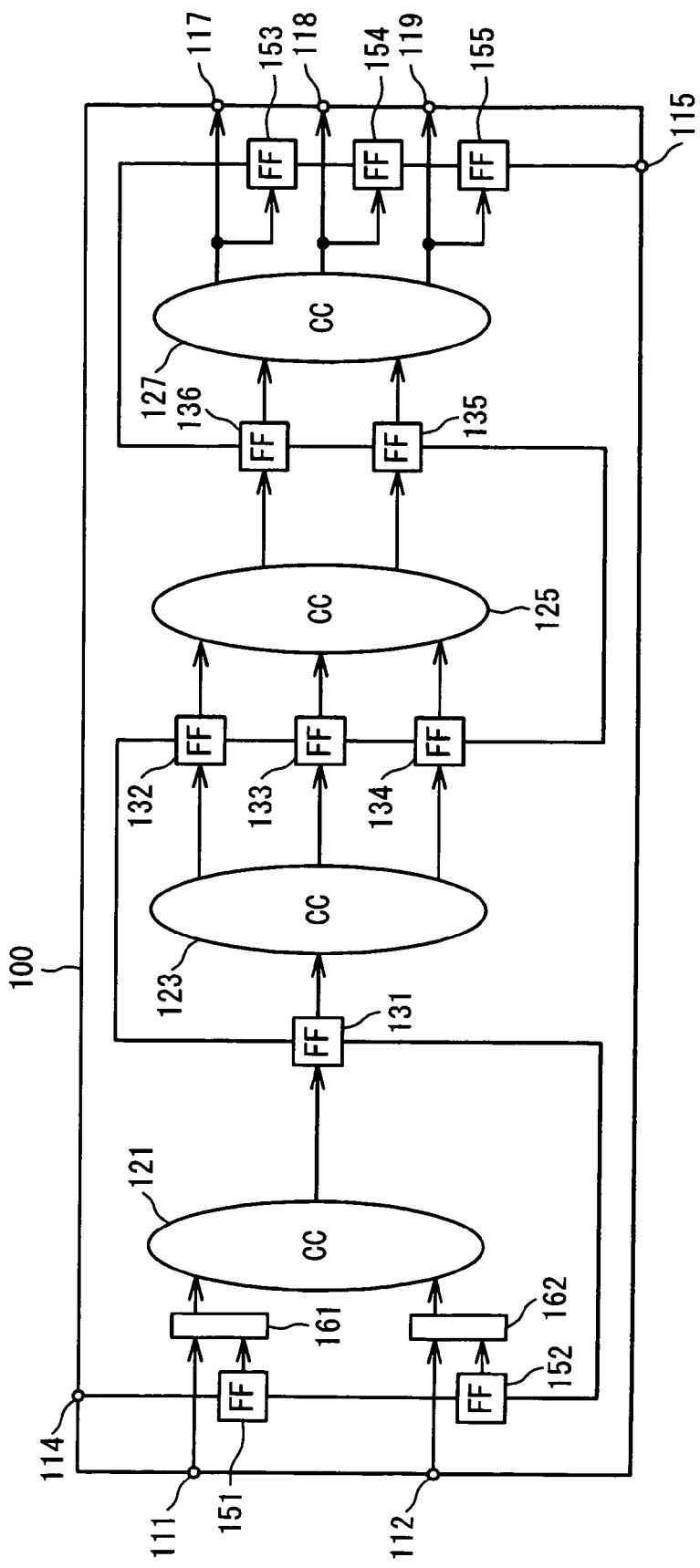
FIG. 2 is a diagram for explaining another example of testing based on the scanning method according to a conventional technique.

The present invention will be now described herein with reference to illustrative embodiments. Those skilled in the art will recognize that many alternative embodiments can be accomplished using the teachings of the present invention and that the present invention is not limited to the present embodiments illustrated for explanatory purposed.

(Configuration)

According to the present invention, it is not necessary to provide any additional flip-flops, and a scan chain as in the conventional technique can be used. Instead, selection circuits are added to a macro circuit, which improves the failure detection rate as will be described below. The additional selection circuits are classified into two kinds on the basis of operations thereof.

A first selection circuit is provided in a pre-stage of a combinational circuit (first combinational circuit) to which an external input data is input, and an output terminal of the first selection circuit is connected to an input of the first combinational circuit. The external input data is input to a macro circuit (internal circuit) through an external input terminal (macro terminal). Therefore, an input terminal of the first selection circuit is connected to the external input terminal. Another input terminal of the first selection circuit is connected to an output of a certain flip-flop (a first memory element). Thus, the first selection circuit receives the external input data from the external input terminal and a stored data held by the first memory element. Depending on an operation mode, the first selection circuit selects and outputs any of the external input data and the stored data. More specifically, in a normal mode, the first selection circuit selects the external input data and outputs the selected data to the first combinational circuit. Thus, the first combinational circuit receives the external input data in the normal mode. On the other hand, in a test mode, the first selection circuit selects the data stored in the first memory element and outputs the selected data to the first combinational circuit. Thus, an input test pattern held by the first memory element can be supplied to the first combinational circuit in the test mode. As described above, the first selection circuit switches the data to be selected between the normal mode and the test mode.

A second selection circuit is provided in a pre-stage of a certain flip-flop (second memory element), and an output terminal of the second selection circuit is connected to an input of the second memory element. The second selection circuit is configured to receive an external output data which a combinational circuit (second combinational circuit) outputs to an external output terminal (macro terminal). That is, an input terminal of the second selection circuit is connected to the output of the second combinational circuit, i.e. the external output terminal. Another input terminal of the second selection circuit is connected to an output of a certain combinational circuit (third combinational circuit). Thus, the second selection circuit receives the external output data from the second combinational circuit and an operation result data from the third combinational circuit. Depending on an operation mode, the second selection circuit selects and outputs any of the external output data and the operation result data. More specifically, in the normal mode and a test mode-A (first test mode), the second selection circuit selects the operation result data output from the third combinational circuit, and outputs the selected data to the second memory element. On the other hand, in a test mode-B (second test mode), the second selection circuit selects the external output data output from the second combinational circuit, and outputs the selected data to the second memory element. As a result, the external output data output from the external output terminal can be latched by the second memory element. Here, an output of the second memory element is connected to an input of a certain combinational circuit, i.e., the second memory element is not a test-specific one. Therefore, the failure detection rate is improved with suppressing the increase in the circuit scale and the circuit area.

Figure 3:
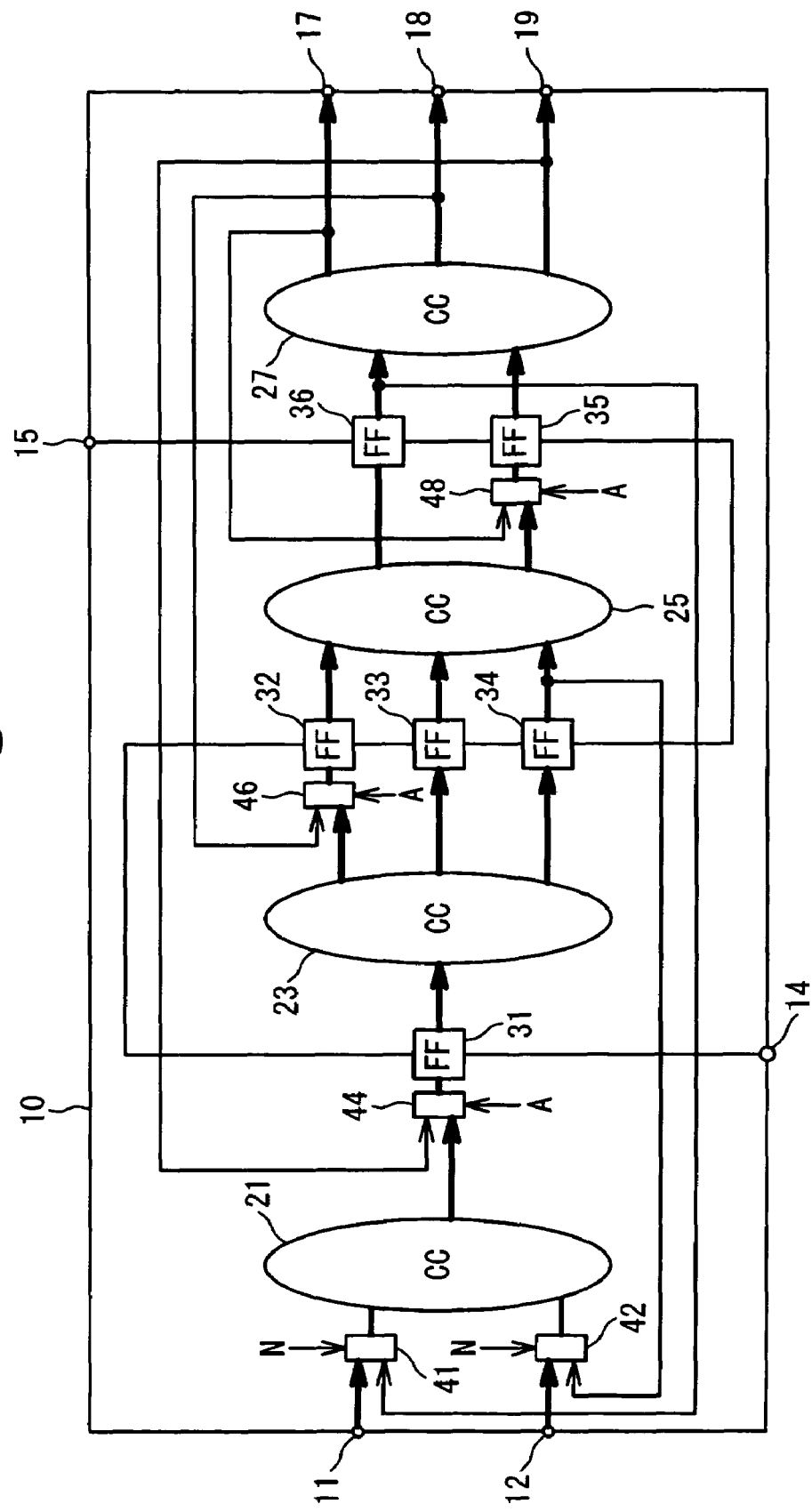
FIG. 3 is a diagram schematically showing a configuration of a macro circuit according to an embodiment of the present invention.

FIG. 3 is a diagram schematically showing a configuration of a macro circuit 10 (internal circuit) mounted on a semiconductor integrated circuit according to the present embodiment. The macro circuit 10 can operate in several operation modes. For example, the several operation modes include the normal mode in which the macro circuit 10 operates normally and the test mode in which the macro circuit 10 is tested based on the scanning method. The test mode further includes several test modes (test mode-A, test mode-B). A range to be tested can be changed by switching the test mode. The mode switching can be controlled outside the semiconductor integrated circuit.

As shown in FIG. 3, the macro circuit 10 has: a plurality of combinational circuits 21, 23, 25 and 27; a plurality of flip-flops (memory elements) 31 to 36; and selection circuits 41, 42, 44, 46 and 48. Each of the selection circuit 41 and the selection circuit 42 corresponds to the above-mentioned first selection circuit. The macro terminals 11 and 12 correspond to the external input terminals. The combinational circuit 21 corresponds to the above-mentioned first combinational circuit, and each of the flip-flops 36 and 34 corresponds to the above-mentioned first memory element. Each of the selection circuit 44, the selection circuit 46 and the selection circuit 48 corresponds to the above-mentioned second selection circuit. The macro terminals 17 to 19 correspond to the external output terminals. The combinational circuit 27 corresponds to the above-mentioned second combinational circuit, and each of the flip-flops 31, 32 and 35 corresponds to the above-mentioned second memory element. Each of the combinational circuits 21, 23 and 25 corresponds to the above-mentioned third combinational circuit.

The first selection circuit 41 receives the external input data from the macro terminal 11 and a data output from the flip-flop 36, selects one of the received data, and outputs the selected data to the combinational circuit 21. The first selection circuit 42 receives the external input data from the macro terminal 12 and a data output from the flip-flop 34, selects one of the received data, and outputs the selected data to the combinational circuit 21. The combinational circuit 21 receives the data output from the first selection circuits 41 and 42, and executes a combination logic operation based on the received data. Then, the combinational circuit 21 outputs an operation result data indicative of the result of the logic operation to the second selection circuit 44.

The second selection circuit 44 receives the operation result data output from the combinational circuit 21 and a data (operation result data) output from the combinational circuit 27. The data from the combinational circuit 27 is the external output data which is output to the outside through the macro terminal 19. The second selection circuit 44 selects one of the operation result data and the external output data, and outputs the selected data to the flip-flop 31. An output of the flip-flop 31 is connected to a combinational circuit 23. The combinational circuit 23 receives a data (stored data) output from the flip-flop 31, and outputs an operation result data to the second selection circuit 46 and the flip-flops 33 and 34. The second selection circuit 46 receives the operation result data output from the combinational circuit 23 and a data (operation result data) output from the combinational circuit 27. The data from the combinational circuit 27 is the external output data which is output to the outside through the macro terminal 18. The second selection circuit 46 selects one of the operation result data and the external output data, and outputs the selected data to the flip-flop 32. Outputs of the flip-flops 32 to 34 are connected to the combinational circuit 25.

The combinational circuit 25 receives data output from the flip-flops 32 to 34, and outputs an operation result data to the second selection circuit 48 and the flip-flop 36. The second selection circuit 48 receives the operation result data output from the combinational circuit 25 and a data (operation result data) output from the combinational circuit 27. The data from the combinational circuit 27 is the external output data which is output to the outside through the macro terminal 17. The second selection circuit 48 selects one of the operation result data and the external output data, and outputs the selected data to the flip-flop 35. Outputs of the flip-flops 35 and 36 are connected to the combinational circuit 27. The combinational circuit 27 receives data output from the flip-flops 35 and 36, and outputs an operation result data to the macro terminals 17, 18 and 19. The operation result data is output as the external output data through the macro terminals 17, 18 and 19.

Furthermore, each of the flip-flops 31 to 36 has a test-specific serial input. In the test operation, the flip-flops 31 to 36 can be connected serially one after another, and can function as a shift register as a whole. A macro terminal 14 is a serial input terminal of the shift register, and a macro terminal 15 is a serial output terminal. Thus, a "scan chain" is constructed. A test pattern input to the serial input terminal 14 is shifted along the scan chain, i.e., the test pattern is shifted in the flip-flops 31 to 36 in order and is output from the serial output terminal 15. Since inputs/outputs of all the combinational circuits 21, 23, 25 and 27 are connected to any of the flip-flops 31 to 36, any failure with respect to the combinational circuits 21, 23, 25 27 can be detected through the automatic scanning method.

(Operation)

Next, operations of the macro circuit 10 according to the present embodiment will be described in detail.

First, a normal operation in the normal mode will be described with reference to FIG. 3. An operation mode of each of the first selection circuits 41 and 42 is set to the normal mode (N). In this case, respective of the first selection circuits 41 and 42 select the external input data input from the macro terminals 11 and 12, and output the external input data to the combinational circuit 21. Also, an operation mode of each of the second selection circuits 44, 46 and 48 is set to the normal mode (A). Here, the setting condition is the same between the normal mode and the test mode-A with regard to the second selection circuits 44, 46 and 48. In this case, respective of the second selection circuits 44, 46 and 48 select the operation result data other than the external output data. As a consequence, external input data entered from the macro terminals 11 and 12 are transferred to the combinational circuit 21 through the first selection circuits 41 and 42. An operation result data output from the combinational circuit 21 is input to the flip-flop 31 through the selection circuit 44. An output data of the flip-flop 31 is input to the combinational circuit 23. Operation result data output from the combinational circuit 23 are input to the flip-flop 32 through the second selection circuit 46 and to the flip-flops 33 and 34 directly. Output data of the flip-flops 32, 33 and 34 are input to the combinational circuit 25. Operation result data output from the combinational circuit 25 are input to the flip-flop 36 directly and to the flip-flop 35 through the second selection circuit 48. Output data of the flip-flops 35 and 36 are input to the combinational circuit 27. Operation result data output from the combinational circuit 27 is output as external output data to the outside through the macro terminals 17, 18 and 19.

Next, a test operation in the test mode will be described with reference to FIGS. 4 to 8. According to the present embodiment, the test mode includes the "test mode-A (first test mode)" and the "test mode-B (second test mode)".

Figure 4:
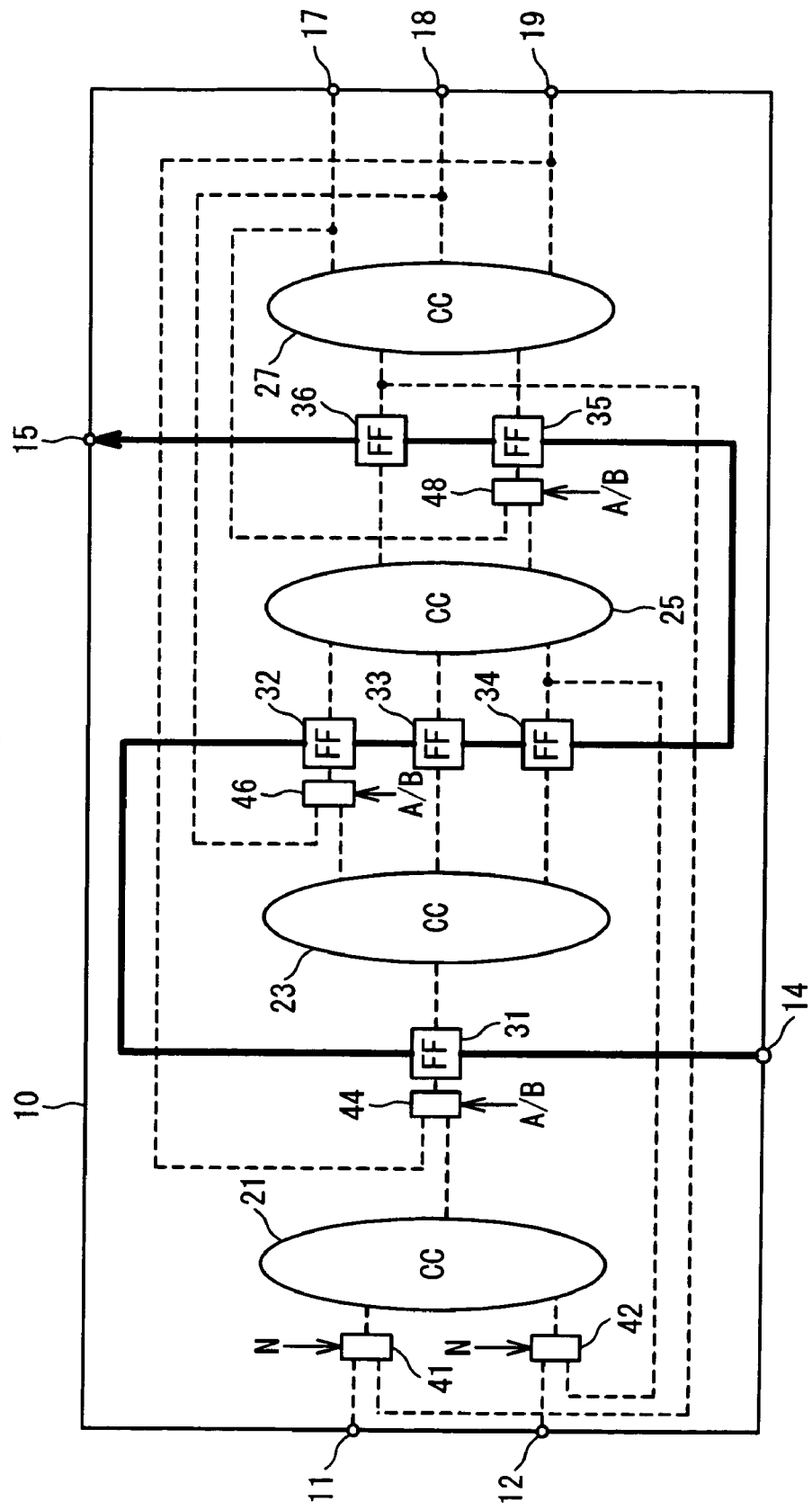
FIG. 4 is a diagram schematically showing a connection in the macro circuit according to the present embodiment, in which a scan chain is constructed.

First, the macro circuit 10 is controlled by an external unit provided outside the semiconductor integrated circuit to be set to the test mode-A. Then, as shown in FIG. 4, the flip-flops 31 to 36 are connected in series along the scan chain. The macro circuit 10 is set to a condition to receive an input test pattern. The test pattern is entered from the macro terminal 14 and is sequentially transferred through the scan chain. When the leading edge of the test pattern input from the macro terminal 14 reaches the flip-flop 36, the setting of the test pattern is completed. As a result, the input test pattern is stored in respective of all the flip-flops 31 to 36.

Figure 5:
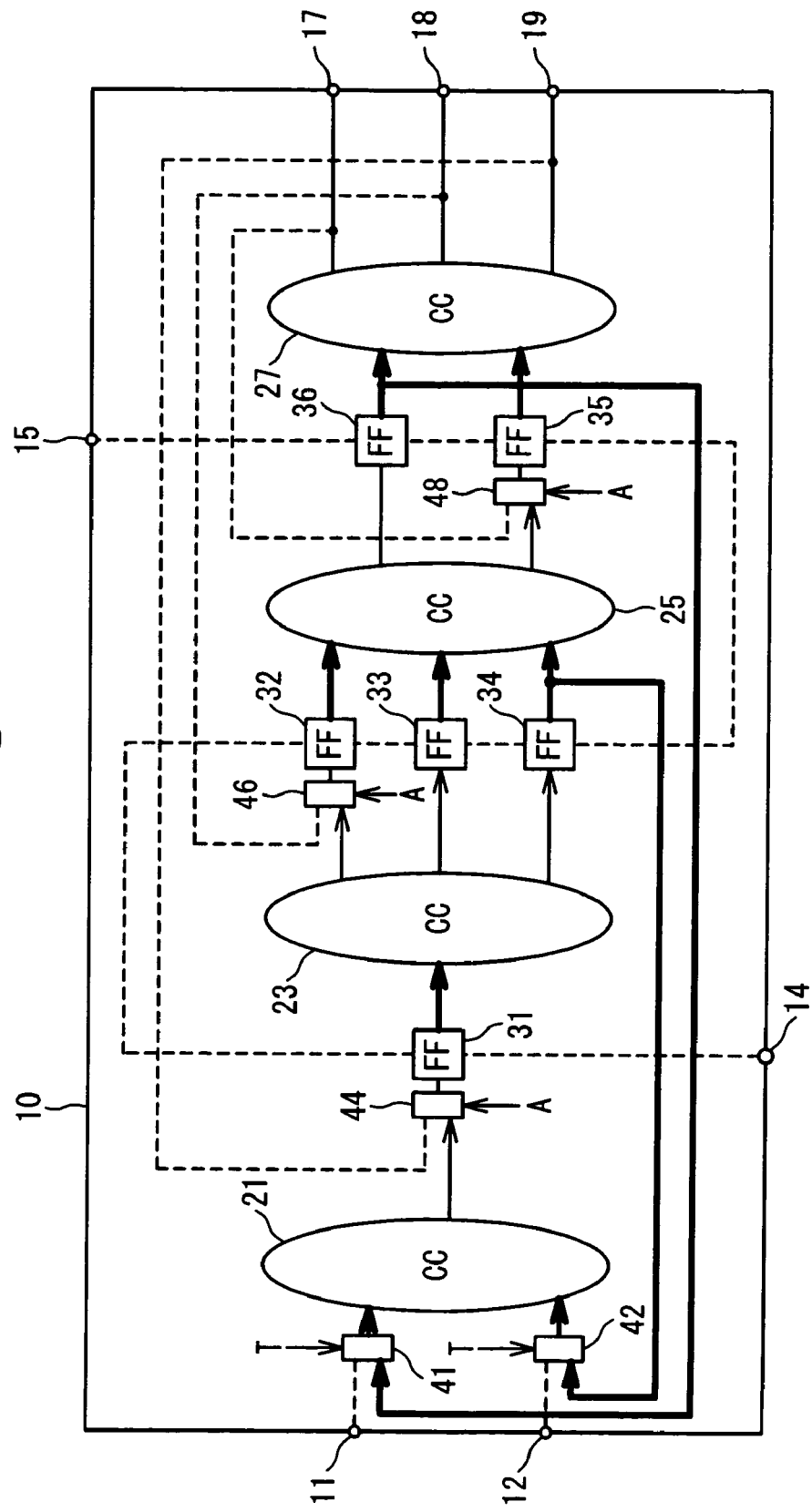
FIG. 5 is a diagram schematically showing a connection in a test mode-A in the macro circuit according to the present embodiment, in which a test pattern is set to the combinational circuits.

After the input test pattern is set in the flip-flops 31 to 36, the above-mentioned scan chain is released. Then, as shown in FIG. 5, the stored data (input test pattern) held by the flip-flops 31 to 36 are input to the corresponding combinational circuits. Here, the operation mode of each of the first selection circuits 41 and 42 is set to the test mode (T). In this case, the first selection circuits 41 and 42 select the test pattern output from the corresponding flip-flops. Therefore, the input test pattern held by the flip-flops 36 and 34 are supplied to the combinational circuit 21 through the first selection circuits 41 and 42, respectively.

Figure 6:
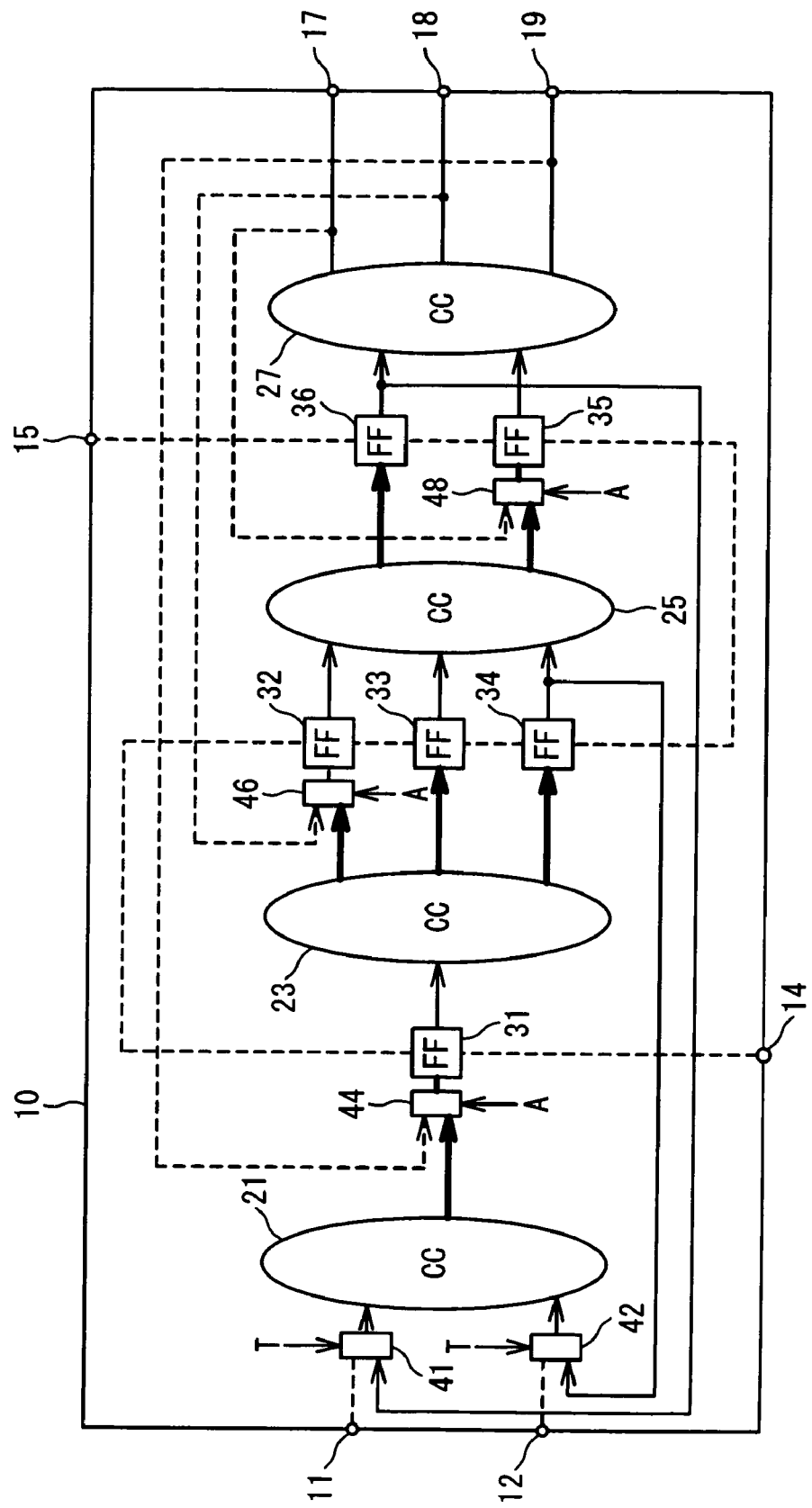
FIG. 6 is a diagram schematically showing a connection in the test mode-A in the macro circuit according to the present embodiment, in which operation result data of the combinational circuits are latched.

When the input test pattern is supplied, each of the combinational circuits 21, 23, 25 and 27 executes the logic operation. As shown in FIG. 6, each of the combinational circuits 21, 23, 25 and 27 outputs an operation result data indicative of the result of the logic operation. Here, the operation mode of each of the second selection circuits 44, 46 and 48 is set to the test mode-A (A). In this case, each of the second selection circuits 44, 46 and 48 selects the operation result data other than the external output data. Therefore, the operation result data output from the combinational circuit 21 is latched by the flip-flop 31. The operation result data output from the combinational circuit 23 is latched by the flip-flops 32, 33 and 34. The operation result data output from the combinational circuit 25 is latched by the flip-flops 35 and 36. It should be noted that the operation result data output from the combinational circuit 27 is not latched by any the flip-flops 31 to 36.

After the operation result data is latched by the respective flip-flops 31 to 36, the scan chain is constructed again. That is, the flip-flops 31 to 36 are connected in series as shown in FIG. 4, and the macro circuit 10 is set to a condition to output an output test pattern. The data (operation result data) held by the flip-flops 31 to 36 are transferred through the scan chain, and are sequentially output from the macro terminal 15 as the output test pattern. The output test pattern includes the operation result data of the combinational circuits 21, 23 and 25. The output test pattern is compared with a predetermined pattern which is prepared through a computer simulation beforehand.

The above-described testing operation is repeatedly carried out until all kinds of input test patterns prepared for the test mode-A are tried. When an output test pattern is being output from the macro terminal 15, the next input test pattern may be input to the macro terminal 14 at the same time. In this case, it is possible to shorten the test time because the input and the output of the test pattern is carried out simultaneously.

After the test mode-A is finished, the next test mode, namely, the test mode-B is started. The macro circuit 10 is controlled by the external unit provided outside the semiconductor integrated circuit to be set to the test mode-B. Then, as in the test mode-A, the flip-flops 31 to 36 are connected in series along the scan chain (see FIG. 4). A test pattern is entered from the macro terminal 14 and is sequentially transferred through the scan chain. When the leading edge of the test pattern input from the macro terminal 14 reaches the flip-flop 36, the setting of the test pattern is completed. As a result, the input test pattern is stored in respective of all the flip-flops 31 to 36.

Figure 7:
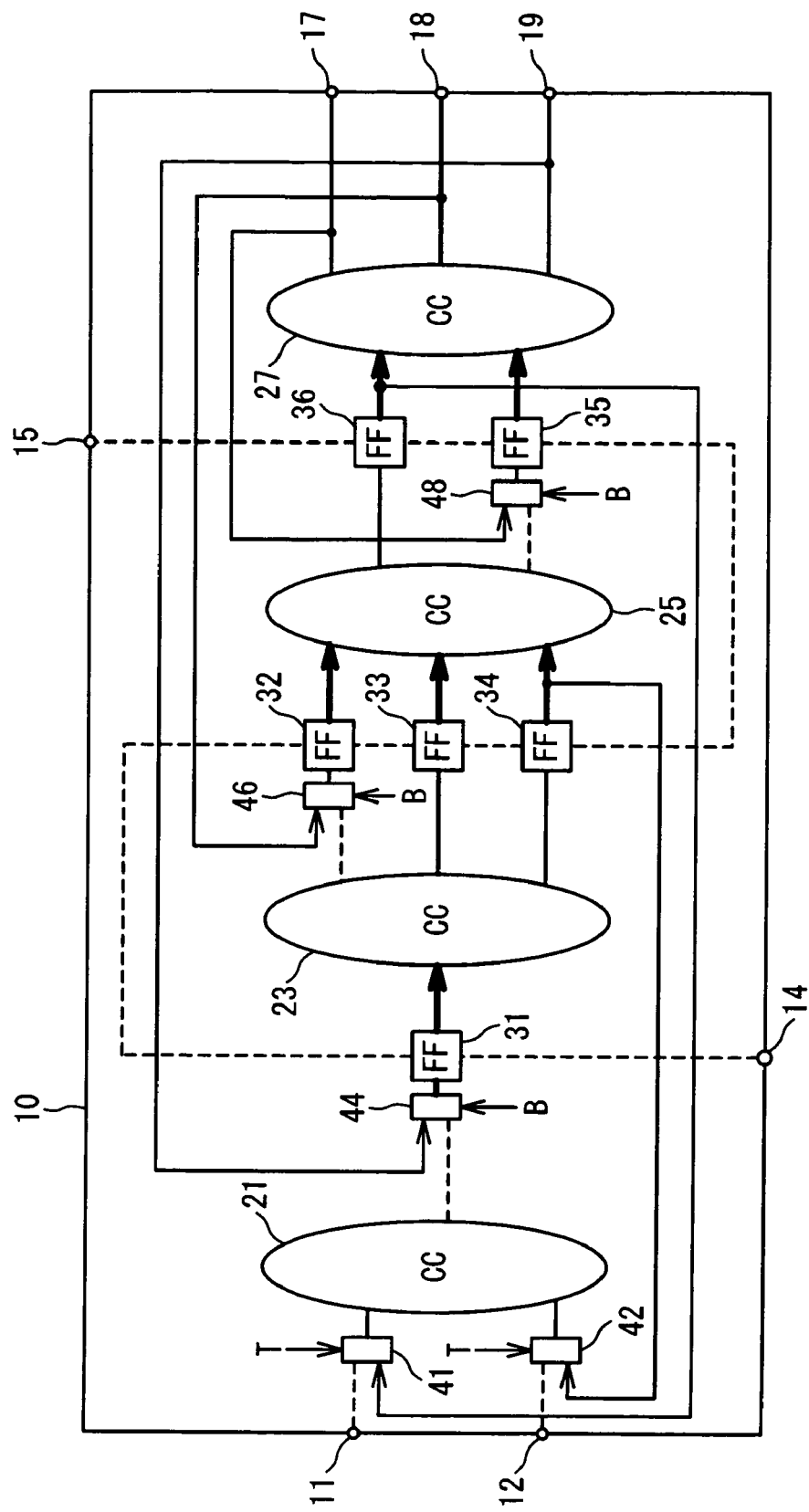
FIG. 7 is a diagram schematically showing a connection in a test mode-B in the macro circuit according to the present embodiment, in which a test pattern is set to the combinational circuits.

After the input test pattern is set in the flip-flops 31 to 36, the above-mentioned scan chain is released. Then, as shown in FIG. 7, the stored data (input test pattern) held by the flip-flops 31 to 36 are input to the corresponding combinational circuits. Here, the operation mode of each of the first selection circuits 41 and 42 is still set to the test mode (T). Therefore, the input test pattern held by the flip-flops 36 and 34 are supplied to the combinational circuit 21 through the first selection circuits 41 and 42, respectively.

Figure 8:
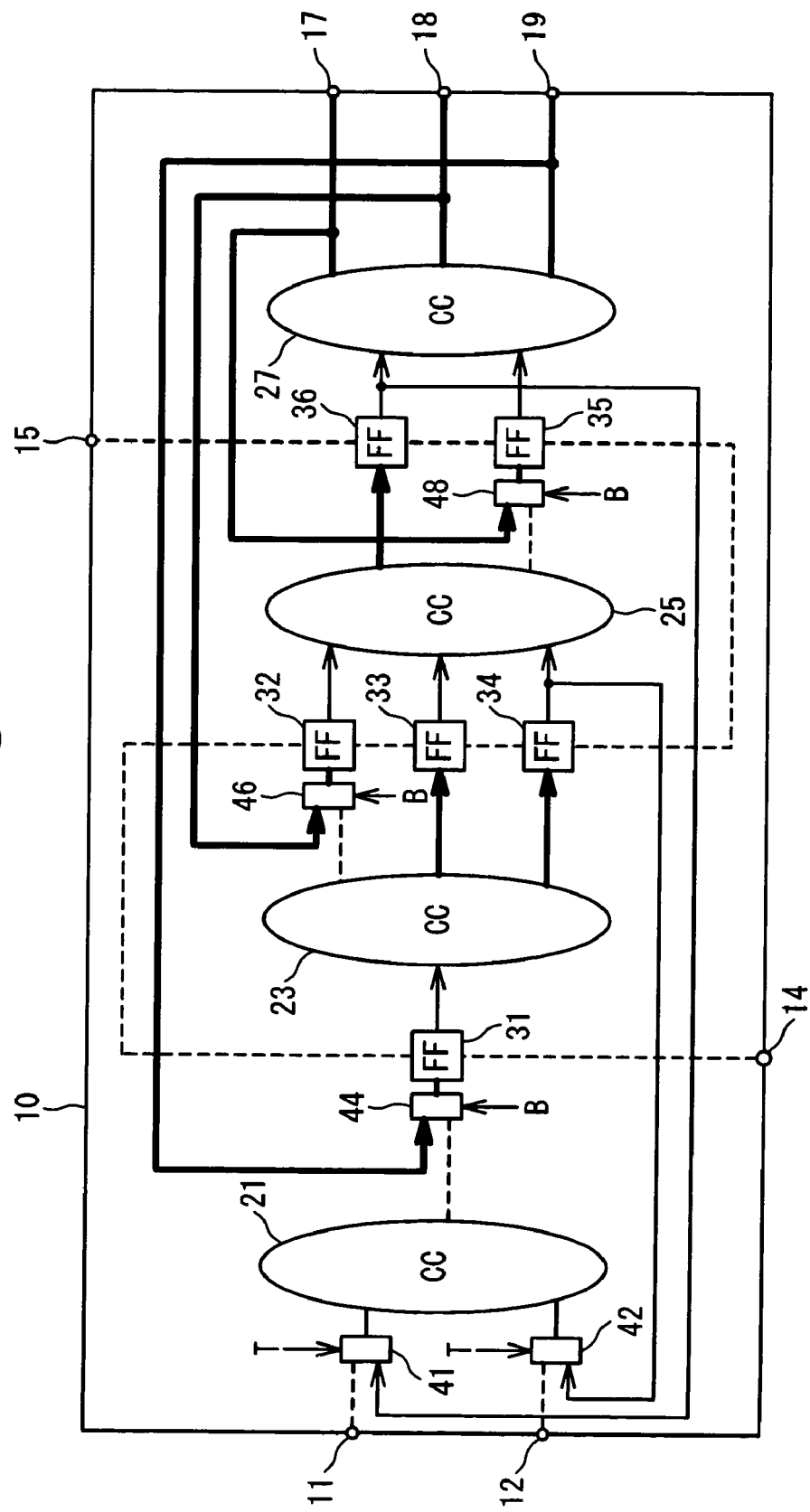
FIG. 8 is a diagram schematically showing a connection in the test mode-B in the macro circuit according to the present embodiment, in which operation result data of the combinational circuits are latched.

When the input test pattern is supplied, each of the combinational circuits 21, 23, 25 and 27 executes the logic operation. As shown in FIG. 8, each of the combinational circuits 21, 23, 25 and 27 outputs an operation result data indicative of the result of the logic operation. Here, the operation mode of each of the second selection circuits 44, 46 and 48 is set to the test mode-B (B). In this case, each of the second selection circuits 44, 46 and 48 selects the external output data (operation result data) output from the combinational circuit 27. Thus, the external output data is not only output from the macro terminals 17, 18 and 19 but also latched by the flip-flops 35, 32 and 31 through respective of the second selection circuits 48, 46 and 44. The operation result data output from the combinational circuit 21 is not latched by the flip-flop 31. The operation result data output from the combinational circuit 23 is not latched by the flip-flops 32. The operation result data output from the combinational circuit 25 is not latched by the flip-flops 35. As described above, the operation result data of the combinational circuit 27 is mainly obtained in the test mode-B.

After the operation result data is latched by the respective flip-flops 31 to 36, the scan chain is constructed again. That is, the flip-flops 31 to 36 are connected in series as shown in FIG. 4, and the macro circuit 10 is set to a condition to output an output test pattern. The data (operation result data) held by the flip-flops 31 to 36 are transferred through the scan chain, and are sequentially output from the macro terminal 15 as the output test pattern. The output test pattern includes the operation result data of the combinational circuits 23, 25 and 27. The output test pattern is compared with a predetermined pattern which is prepared through a computer simulation beforehand.

The above-described testing operation is repeatedly carried out until all kinds of input test patterns prepared for the test mode-B are tried. When an output test pattern is being output from the macro terminal 15, the next input test pattern may be input to the macro terminal 14 at the same time. In this case, it is possible to shorten the test time because the input and the output of the test pattern is carried out simultaneously.

When the test mode-B is finished, the operation mode of the macro circuit 10 is set to the normal mode shown in FIG. 3. As described above, it becomes possible to derive the operation result data of the combinational circuits 21 and 27 without providing any additional flip-flops.

Figure 9:
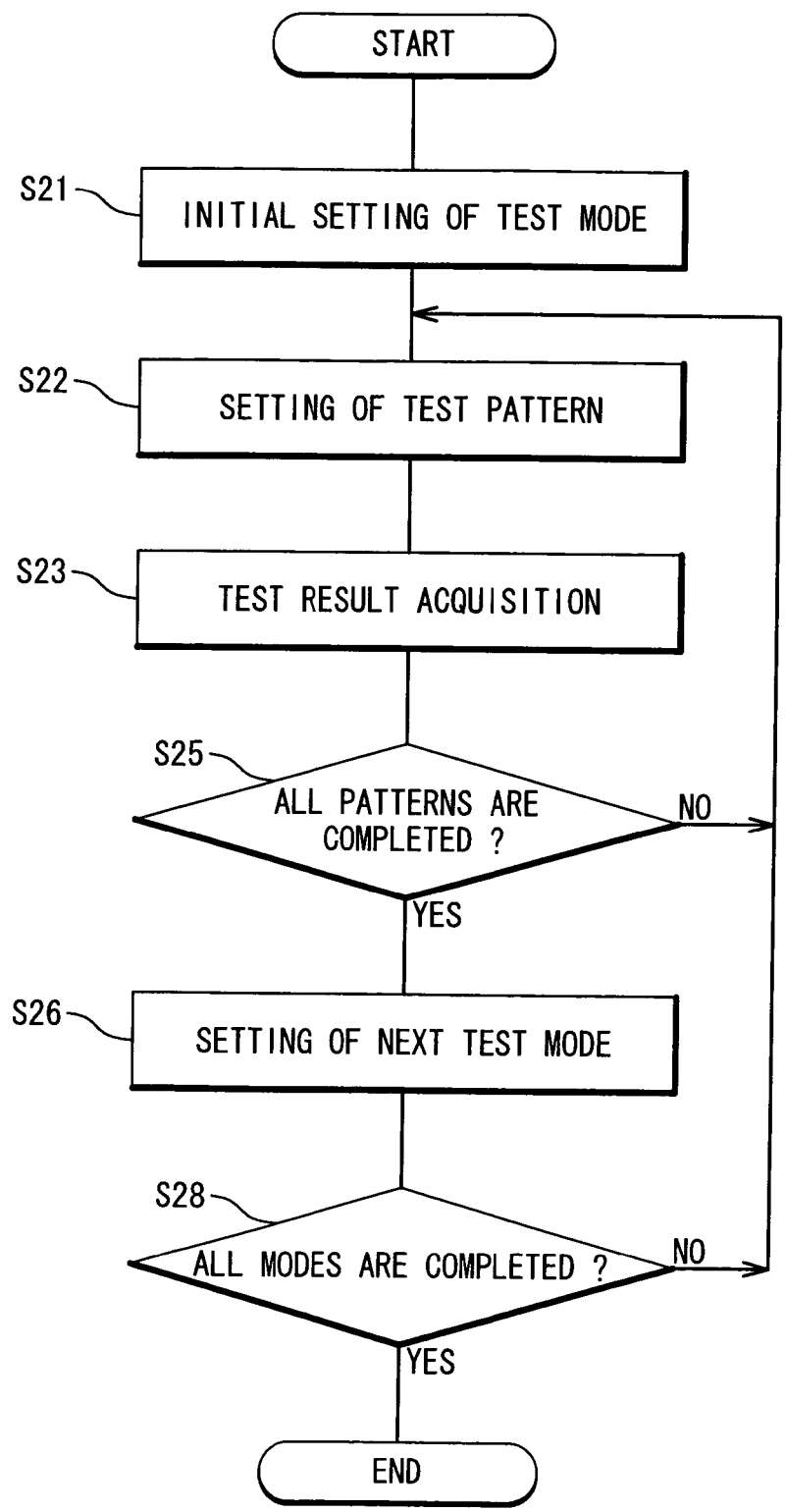
FIG. 9 is a flow chart showing a method of testing the macro circuit according to the present embodiment.

FIG. 9 is a flow chart which summarizes the above-mentioned testing operation. According to the present embodiment, the test mode includes the test mode-A and the test mode-B. However, the macro circuit 10 may be designed to have more test modes. Depending on a relationship between the combinational circuits, flip-flops and macro terminals, the macro circuit 10 may have a large number of test modes.

(Step S21: Initial Setting)

First, the semiconductor integrated circuit is controlled to be set to the test mode for testing the macro circuit. Then, initial setting is performed. The test mode starts from the test mode-A, in which the second selection circuit functions as in the normal mode.

(Step S22: Setting of Test Pattern)

The flip-flops are serially connected one after another to be a shift register, and thus a scan chain is formed. Thereafter, a test pattern of serial data is input to the macro circuit. The input test pattern is sequentially transferred through the shift register. Then, the input test pattern is set in the respective flip-flops which constitute the scan chain. When the test pattern is set in the respective flip-flops, the serial connection of the shift register is released. The stored data (input test pattern) held by the respective flip-flops are supplied to corresponding combinational circuits. Here, the selection circuit selects and outputs data on the basis of the type of the test mode. Each combinational circuit outputs the operation result data based on the input test pattern.

(Step S23: Acquisition of Test Result)

When the operation result data are output from the combinational circuits, the flip-flops latch the operation result data. In order to derive the latched operation result data, the flip-flops are serially connected again so that the flip-flops form the scan chain. The operation result data latched by the respective flip-flops are shifted along the scan chain, and are sequentially output as an output test pattern.

(Step S25)

When the operation result data of the combinational circuits are derived, it is checked whether all the input test patterns are completed or not. If there is any test pattern left (Step S25; No), the next input test pattern is set and the above-mentioned Steps S22 and S23 are carried out similarly. If all the input test patters are completed (Step S25; Yes), the testing in the present test mode is ended.

(Step S26: Setting of Next Test Mode)

When one test mode is finished, the operation mode is set to the next test mode. For example, when the test mode-A is completed, the operation mode is switched to the test mode-B. As a result, the setting of the selection circuit is also changed.

(Step S28)

If there is any test mode left (Step S28; No), the above-mentioned Steps S22 to S25 are carried out similarly. If all the test modes are completed (Step S28; Yes), the testing of the macro circuit is finished and the operation mode is set to the normal mode.

According to the present invention, as described above, the first selection circuit is configured to receive not only an internal data generated in the macro circuit but also an external data input from an external circuit to the macro circuit, and to selects one of them. The second selection circuit is configured to receive an internal data generated in the macro circuit but also an external data output from the macro circuit to an external circuit. Due to the first and the second selection circuits thus configured, it is possible to test all the combinational circuits in a time-division manner. Here, it is not necessary to provide any additional test-specific flip-flops (memory element). It is thus possible to improve the failure detection rate with suppressing the increase in the circuit scale and the circuit area.

It is preferable to provide the first selection circuit and the second selection circuit in the vicinity of the macro terminal (external input/output terminal) such that a wiring efficiency is not deteriorated. It is also preferable that a memory element in the vicinity of the second selection circuit is selected as the second memory element which is provided in a post-stage of the second selection circuit. When it is found after the first selection circuit and the second selection circuit are arranged that the wiring efficiency is not good, the first and the second memory element may be reselected based on the arrangement information.

It should be noted that a macro terminal which is directly connected to an input of a flip-flop and a macro terminal which is directly connected to an output of the flip-flop are involved in the scan chain. Therefore, it is not necessary to provide a selection circuit for such the macro terminals.

In the foregoing description, each of the first selection circuits and the second selection circuits has two input terminals. Alternatively, the selection circuit may have more input terminals depending on a relationship between the number of output macro terminals and the number of flip-flops. The combinational circuits may be classified into more number of groups to be tested, which increases multiplicity of the testing. In this case, test modes corresponding to the multiplicity are necessary, and the operation mode is switched between the large number of test modes. Moreover, in the foregoing description, the test mode is switched after all the test patterns for a certain test mode are completed. Alternatively, the test mode may be changed for every test pattern.

According to the present invention, an existing flip-flop is used as the first memory element, which can set an input test pattern in the first combinational circuit connected to the macro terminal on the input side. Moreover, an existing flip-flop is used as the second memory element, which can latch an output data of the second combinational circuit connected to the macro terminal on the output side. By utilizing the existing flip-flops in a time-division manner, it is possible to test the first and the second combinational circuits without employing any additional flip-flop. In other words, it is possible to improve the failure detection rate without providing test-specific flip-flops. Here, an area occupied by the selection circuit is much smaller than the area occupied by the test-specific flip-flops. Thus, the present invention has an advantage from the view point of the chip area.

Although the macro circuit (IP core) is described as an example in the foregoing embodiment, the present invention can be applied to any circuit which is tested based on the scanning method. It is apparent that the present invention is not limited to the above embodiment, and that may be modified and changed without departing from the scope and spirit of the present invention.

What is claimed is:

1. A macro circuit, comprising:
   a first combinational circuit receiving a first input data to output a first operation result in a normal mode;
   a first memory element coupled to said first combinational circuit in said normal mode to latch said first operation result and to output said latched first operation result as a second input data;
   a second combinational circuit coupled to said first memory element in said normal mode to receive said second input data from said first memory element, and to output a second operation result based on said received second input data in said normal mode;
   a second memory element coupled to said second combinational circuit in said normal mode to latch said second operation result and to output said latched second operation result as a third input data;
   a third combinational circuit coupled to said second memory element in said normal mode to receive said third input data from said second memory element, and to output a third operation result based on said received third input data in said normal mode;
   a third memory element coupled to said third combinational circuit in said normal mode to latch said third operation result, and to output said latched third operation result as a fourth input data;
   a fourth combinational circuit coupled to said third memory element in said normal mode to receive said fourth input data from said third memory element in said normal mode; and
   a scan chain including said first, second, and third memory elements to perform a test of said first, second, third, and fourth combinational circuits in a test mode,
   wherein said third memory element latches a test pattern for said test through said scan chain to provide said latched test pattern to both said fourth combinational circuit and said first combinational circuit in said test mode.

2. The macro circuit according to claim 1, wherein said first combinational circuit receives said test pattern from said third memory element without intervention of another memory element in said test mode.

3. The macro circuit according to claim 1, further comprising:

a fourth memory element included in said scan chain and coupled to said fourth combinational circuit to latch another test pattern for said test through said scan chain and to provide said another test pattern to said fourth combinational circuit, wherein said fourth memory element further latches an operation result output from said fourth combinational in said test mode.

4. The macro circuit according to claim 1, wherein said first memory element receives another test pattern for said test through said scan chain to provide said another test pattern to said second combinational circuit, and is further coupled to said fourth combinational circuit to latch an operation result output from said fourth combinational circuit in said test mode.

5. The macro circuit according to claim 1, wherein said second memory element receives another test pattern for said test through said scan chain to provide said another test pattern to both said third combinational circuit and said first combinational circuit in said test mode.

* * * * *